US007666063B2

United States Patent
Kozasa et al.

(10) Patent No.: US 7,666,063 B2
(45) Date of Patent: Feb. 23, 2010

(54) ROUGH POLISHING METHOD OF SEMICONDUCTOR WAFER AND POLISHING APPARATUS OF SEMICONDUCTOR WAFER

(75) Inventors: Kazuaki Kozasa, Hiratsuka (JP); Tomonori Kawasaki, Hiratsuka (JP); Kosuke Miyoshi, Hiratsuka (JP)

(73) Assignee: Sumco Techxiv Corporation, Hiratsuka-Shi (JP)

( * ) Notice: Subject to any disclaimer, the term of this patent is extended or adjusted under 35 U.S.C. 154(b) by 0 days.

(21) Appl. No.: 12/250,356

(22) Filed: Oct. 13, 2008

(65) Prior Publication Data

US 2009/0042482 A1 Feb. 12, 2009

Related U.S. Application Data

(62) Division of application No. 11/906,073, filed on Sep. 28, 2007, now Pat. No. 7,540,800.

(30) Foreign Application Priority Data

Sep. 29, 2006 (JP) .............................. 2006-267286

(51) Int. Cl.
*B24B 49/00* (2006.01)
(52) U.S. Cl. ............................... 451/5; 451/8; 451/287; 451/446
(58) Field of Classification Search ...................... 451/5, 451/8, 36, 37, 41, 57, 60, 285, 287, 446; 216/84, 88, 89; 438/692
See application file for complete search history.

(56) References Cited

U.S. PATENT DOCUMENTS

| 5,885,334 | A | 3/1999 | Suzuki et al. |
| 5,914,275 | A | 6/1999 | Kodera et al. |
| 6,189,546 | B1 | 2/2001 | Zhang et al. |
| 2001/0037821 | A1 | 11/2001 | Staley et al. |
| 2003/0077982 | A1 | 4/2003 | Takizawa |

FOREIGN PATENT DOCUMENTS

| JP | 7-314324 A | 12/1995 |
| JP | 2000-015571 A | 1/2000 |
| JP | 3202305 B2 | 6/2001 |

*Primary Examiner*—Eileen P. Morgan
(74) *Attorney, Agent, or Firm*—Frishauf, Holtz, Goodman & Chick, P.C.

(57) ABSTRACT

A rough-polishing method for conducting a rough polishing before mirror-finish polishing on a semiconductor wafer using a polishing apparatus includes a first polishing step for polishing the semiconductor wafer using slurry containing colloidal silica supplied by a slurry supplying unit and a second polishing step for polishing the semiconductor wafer using alkali solution provided by mixing deionized water supplied from a deionized-water supplying unit and alkali concentrate solution supplied by an alkali-concentrate-solution supplying unit. The pH value of the alkali solution and polishing time in the second polishing step are determined based on the load current value of the polishing table in the first polishing step.

3 Claims, 6 Drawing Sheets

ROUGH POLISHING METHOD OF SEMICONDUCTOR WAFER AND POLISHING APPARATUS OF SEMICONDUCTOR WAFER

CROSS REFERENCE TO RELATED APPLICATIONS

The present application is a Divisional Application of U.S. application Ser. No. 11/906,073 filed Sep. 28, 2007 now U.S. Pat. No. 7,540,800 which is incorporated herein by reference and which claims the benefit of priority of Japanese application No. 2006-267286 filed Sep. 29, 2006.

BACKGROUND OF THE INVENTION

1. Field of the Invention

The present invention relates to a rough-polishing method of a semiconductor wafer and a polishing apparatus of a semiconductor wafer.

2. Description of Related Art

In a polishing process of a semiconductor wafer, in order to average the roughness of the entire surface of a the semiconductor wafer with etching pits and the like formed during preceding (etching) process, a rough-polishing step is often conducted before final finish-polishing step. During the rough-polishing step, the surface of the semiconductor wafers undergoes one-stage polishing, or, alternatively, multi-stage polishing using different polishing slurries in accordance with the depth of the etching pits.

By the rough-polishing step, the surface of the semiconductor wafer is smoothed to a constant roughness. In the finish-polishing step, the constant surface roughness is removed to create further minute surface roughness condition (Haze).

In order to remove the surface roughness formed during the rough-polishing process by the finish polishing, considerable amount of work is necessary during the finish polishing. The surface roughness of the semiconductor wafer during the rough-polishing step is caused by transcription of polishing pad attached on a polishing table. Accordingly, by further smoothing the polishing pad during the rough-polishing step, the surface roughness of the semiconductor wafer after the rough-polishing step can be made constant.

In view of the above, it has been traditionally known to apply a seasoning process on the surface of polishing pad using a diamond grinding stone.

Alternatively, it has been proposed to gradually raise rotating speed of polishing table during rough-polishing step (see, for instance, Document: JP2000-15571 A).

However, when a seasoning process is applied before rough-polishing, since the most appropriate polishing condition for a polishing pad of which condition is constantly changing differs at each time, it is difficult to stably obtain a constant surface roughness.

Further, when a seasoning process is frequently conducted in order to stabilize the surface roughness of semiconductor wafer, productivity of the semiconductor wafer is deteriorated during polishing process.

On the other hand, when a rotating speed of a polishing table is gradually raised during rough-polishing, since polishing table is thermally expanded on account of frictional heat generated against semiconductor wafers, it becomes difficult to keep the flatness of semiconductor wafers.

SUMMARY OF THE INVENTION

An object of the present invention is to provide a polishing method and a polishing apparatus of a semiconductor wafer, in which surface roughness of semiconductor wafer can be stabilized during a rough-polishing step and a finish-polishing step can be efficiently conducted.

A rough-polishing method of a semiconductor wafer according to an aspect of the present invention is conducted before mirror-finish polishing of the semiconductor wafer for processing an etched surface of the semiconductor wafer to a constant roughness, the method including: polishing the surface of the semiconductor wafer while, in a continuous or phased manner, changing a polishing solution from slurry containing colloidal silica to an alkali solution in accordance with progress of the polishing.

In changing the slurry to the alkali solution, the supplying amount of the slurry may be gradually decreased and the amount of the deionized water may be gradually increased and the semiconductor wafer is rinsed solely by deionized water for a predetermined time before supplying the alkali solution. Alternatively, the supply of the slurry is completely shut and the semiconductor wafer is rinsed by deionized water and, thereafter, the alkali solution may be mixed into the deionized water to be supplied.

According to the above arrangement, sufficient polishing rate can be secured at an initial stage by slurry-polishing, which is transitioned into alkali-solution polishing in a continuous or phased manner to conduct the polishing with small amount of colloidal silica to even the roughness on the surface of the semiconductor wafer. Incidentally, even when only the alkali solution is supplied, since the silica of the slurry is entangled in the polishing pad in the polishing step, the semiconductor wafer can be polished.

In the above aspect of the invention, the polishing preferably include: a first polishing step for polishing the surface of the semiconductor wafer with the slurry containing colloidal silica; and a second polishing step for polishing the surface of the semiconductor wafer with the alkali solution.

In this case, the second polishing step preferably employs at least one of KOH, NaOH, LiOH and TMAH (TetramethylAmmonium Hydroxide) as the alkali solution and is preferably conducted at a pH value from pH10 or more to less than pH12.

According to the above arrangement, since the process can be transitioned into the second polishing step while checking the polishing level of the surface of the semiconductor wafer by the first polishing step, it is possible to secure necessary polishing level necessary for rough-polishing in the first polishing step and the surface of the semiconductor wafer can be evened at a constant roughness in the second polishing step.

Further, since the above-listed alkali is used as the alkali solution and the pH value is set within a range of 10-12 in the second polishing step, the roughness of the surface of the semiconductor wafer can be further stabilized.

Further, the pH of the alkali solution in the second polishing step is preferably determined based on a root means square roughness of the surface of the semiconductor wafer after the first polishing step.

The root means square roughness may be determined as a value measured in accordance with, for instance, JIS (Japanese Industrial Standards) B0601.

According to the above arrangement, since the pH of the alkali solution in the second polishing step is determined after checking the surface roughness of the semiconductor wafer after the first polishing step, the second polishing step can be conducted after accurately recognizing the polishing condition in the preceding step, so that the surface roughness in the rough-polishing step can be further securely stabilized.

When the rough-polishing is conducted in two-stages, i.e. the first polishing step and the second polishing step, it is preferable that a drive current value of a polishing table of a polishing apparatus for polishing the semiconductor wafer in the first polishing step is detected, a load current of the polishing table is calculated based on the detected drive current of the polishing table, and the pH value of the alkali solution in the second polishing step is determined based on the calculated load current.

Specifically, in order to determine the pH value of the alkali solution in the second polishing step, it is preferable that the pH value of the alkali solution is calculated according to the following equation (1), where the root mean square roughness of the surface of the semiconductor wafer in the first polishing step is Rq, the load current value of the polishing table is I, the pH value of the slurry is SpH, the pH value of the alkali solution in the second polishing step is ApH and polishing time in the second polishing step is t, $$Rq = C(I-Ao)*10^{(-\lambda(SpH-ApH)t)} \quad (1)$$

and where C and Ao are constant, and λ is an empirically-calculated correction coefficient.

According to the above arrangement, since the pH value of the alkali solution in the second polishing step can be calculated by the equation (1) only by calculating the load current of the polishing table in the first polishing step, the condition of the second polishing step can be easily determined.

A polishing apparatus of a semiconductor wafer for polishing a semiconductor wafer according to another aspect of the present invention includes: a polishing table rotated by a drive current and provided with a polishing pad; a slurry-supplying unit for supplying polishing slurry to the polishing table; a controller for controlling the polishing table and the slurry-supplying unit, the semiconductor wafer being pressed onto the polishing table and being polished by the slurry supplied by the slurry-supplying unit; an alkali-concentrate-solution supplying unit for supplying an alkali concentrate solution to the polishing table; a deionized-water supplying unit for supplying deionized water to the polishing table; a flow-regulating valve that adjusts the flow rate of the alkali concentrate solution from the alkali-concentrate-solution supplying unit; and a drive current detecting unit that detects the drive current to the polishing table, the controller includes: a load current calculating unit that calculates a load current generated on the polishing table while polishing using the slurry based on the drive current detected by the drive current detecting unit; a pH value calculating unit that calculates a pH value of an alkali solution supplied from the flow-regulating valve to the polishing table, the alkali solution being prepared by mixing the alkali concentrate solution and the deionized water, and a flow control unit for controlling the flow rate of the flow-regulating valve based on the calculated pH value.

The pH value by the pH calculating unit is preferably calculated in accordance with the above-mentioned equation (1).

According to the above aspect, since the automatic control by an arithmetic processing by the controller is possible, the rough-processing method of the semiconductor wafer according to the above aspect of the present invention can be automatically conducted by an polishing apparatus, thereby considerably reducing the workload.

In the above, when a pH value detecting unit for detecting the pH value of the alkali solution to be supplied to the polishing table is provided on a downstream of the flow-regulating valve, the controller preferably includes a command control unit that adjusts a control command from the flow control unit based on the pH value detected by the pH value detecting unit.

According to the above arrangement, since the pH value of the alkali solution supplied by the flow control unit is detected and the ratio of alkali concentrate solution and deionized water to be allocated by the flow control unit can be adjusted by the command control unit, the pH value of the alkali solution can be further securely managed.

DETAILED DESCRIPTION OF PREFERRED EMBODIMENT(S)

An exemplary embodiment of the present invention will be described below.

[1] Production Process of Semiconductor Wafer

Figure 1:
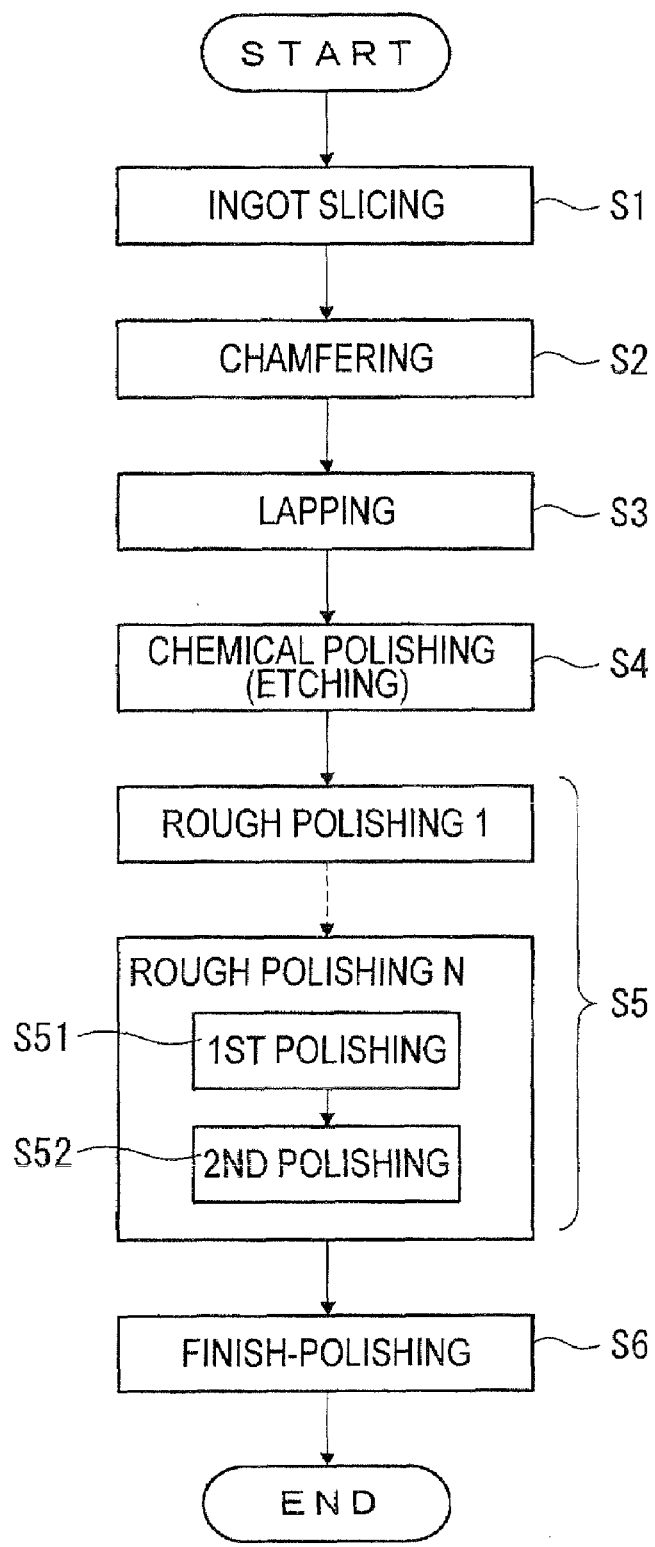
FIG. 1 is a flowchart showing a production process of semiconductor wafer according to an embodiment of the present invention.

FIG. 1 shows a production process of a semiconductor wafer according to an embodiment of the present invention.

Initially, an ingot drawn up by CZ (Czochralski) method and the like is sliced with a multi-wire saw and the like (Step S1), which is chamfered at corners and the like (Step S2) and is lapped (Step S3).

After the lapping step S3 and after being chemically polished by etching (Step S4), the semiconductor wafer is applied with rough-polishing (Step S5).

A multiple of the rough-polishing step S5 are conducted in accordance with occurrence condition of etching pits. In Nth rough-polishing step immediately before finish-polishing step S6, the rough-polishing is conducted in two stages of a first polishing step S51 and a second polishing step S52.

The first polishing step S51 is conducted in the same manner as an ordinary rough-polishing while supplying a slurry containing colloidal silica.

In the second polishing step S52, the rough-polishing is continued while switching from slurry-supply to alkali solution supply.

After Nth rough-polishing (final stage) is completed, finish polishing is conducted (Step S6).

[2] Entire Arrangement of Polishing Apparatus

Figure 2:
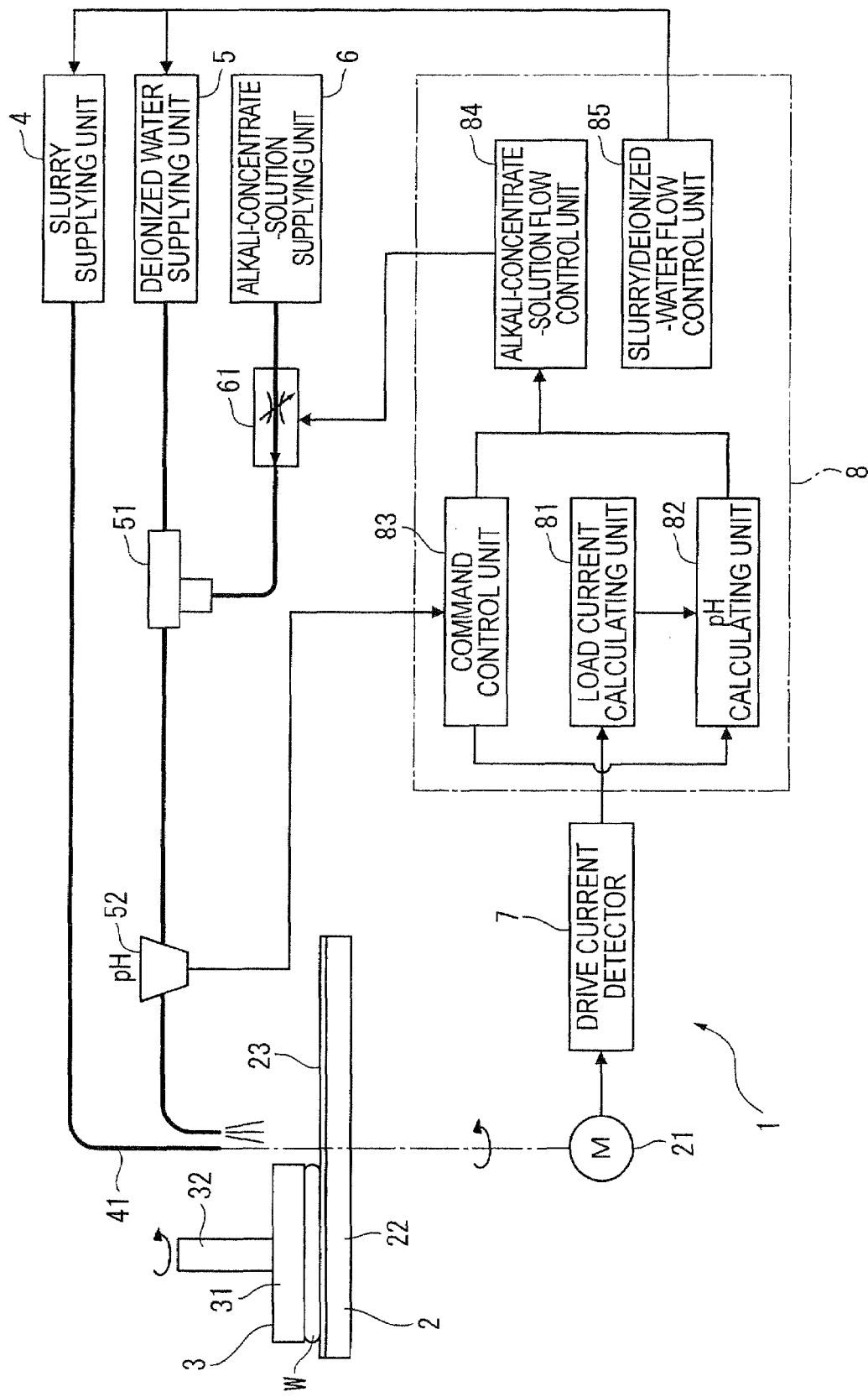
FIG. 2 is a schematic illustration showing an arrangement of a polishing apparatus of the above embodiment.

The above-described rough-polishing step S5 is conducted by a polishing apparatus 1 shown in FIG. 2.

The polishing apparatus 1 is a sheet-feed polishing apparatus, which includes a polishing table 2, a polishing head 3, a slurry-supplying unit 4, a deionized-water supplying unit 5, an alkali-concentrate-solution supplying unit 5, a drive current detector 7 and a controller 8.

The polishing table 2 includes a table body 22 rotated by a motor 21, and a polishing cloth 23 attached on the table body 22 through an elastic material such as a sponge. A polished surface of a semiconductor wafer W is in contact with the polishing cloth 23.

The polishing head 3 includes a disc-shaped pressing portion 31 of approximately the same diameter as the semiconductor wafer W and a drive shaft 32 provided at a circle center of the pressing portion 31. While pressing the semiconductor wafer W onto the polishing table 2 with a predetermined load, the pressing portion 31 is rotated in accordance with the rotation of the drive shaft 32 by a power source (not shown), in accordance with which the pressed semiconductor wafer W is also rotated.

The slurry-supplying unit 4 supplies slurry containing colloidal silica on the polishing table. Though not illustrated, the slurry-supplying unit 4 sucks the slurry in a slurry tank by a pump and the like to feed the slurry onto the polishing cloth 23 of the polishing table 2.

After completing the polishing of the semiconductor wafer W by the slurry supplied from the slurry-supplying unit 4 to the polishing table 2, the deionized-water supplying unit 5 supplies deionized water for rinsing. The deionized-water supplying unit 5 is provided with an aspirator 51 and a pH meter 52 on a part of a pipework for supplying deionized water to the polishing table 2.

The aspirator 51 reduces the pressure inside the pipework from the alkali-concentrate-solution supplying unit 6 when the deionized water flows through inside of the pipework to mix alkali concentrate solution with the deionized water. The pH meter 52 measures pH value of the alkali solution mixed by the aspirator 51 and output the pH value to the controller 8 as an electric signal.

The alkali-concentrate-solution supplying unit 6 supplies alkali concentrate solution to the deionized-water supplying unit 5, which includes a flow-regulating valve 61. The alkali concentrate solution supplied by the alkali-concentrate-solution supplying unit 6 is, for instance, KOH, NaOH, LiOH, TMAH (TetraMethylAmmonium Hydroxide).

The flow-regulating valve 61 is an electromagnetic-control valve that changes flow rate based on a control command from the controller 8. The opening degree of the flow-regulating valve 61 is regulated to adjust the amount of the alkali concentrate solution to be mixed by the aspirator 51, thereby changing the pH value of the alkali solution supplied to the polishing table 2.

The drive current detector 7 detects the electric current value supplied to the motor 21 that rotates the table body 22. The detected current value is outputted to the controller 8 as an electric signal.

The controller 8 conducts control of the entire polishing apparatus 1, including rotation control of the polishing table 2 and the polishing head 3, supply amount control of the slurry-supplying unit 4 and the deionized-water supplying unit 5 and opening degree control of the flow-regulating valve 61. The controller 8 includes, as a program executed thereon, a load-current calculating unit 81, a pH-calculating unit 82, a command control unit 83, an alkali-concentrate flow control unit 84 and slurry/deionized-water flow control unit 85.

The load-current calculating unit 81 calculates how much load current is generated on the polishing table 2 at present time. The load current can be calculated as, for instance, a drive current value applied on a drive motor of the polishing table 2 when the semiconductor wafer W is polished on the polishing table 2.

The pH calculating unit 82 calculates pH value of alkali solution in the second polishing step S52 based on the load current value calculated by the load-current calculating unit 81, in which the pH value ApH of the alkali solution is calculated based on the above equation (1), where root mean square roughness (RMS: referred to as micro-roughness hereinafter) is Rq, the load current value of the polishing table 2 is I, pH value of the slurry in the first polishing step S51 is SpH, pH value of the alkali solution in the second polishing step S52 is ApH and polishing time in the second polishing step S52 is t.

The above equation (1) is established as follows.

Figure 3:
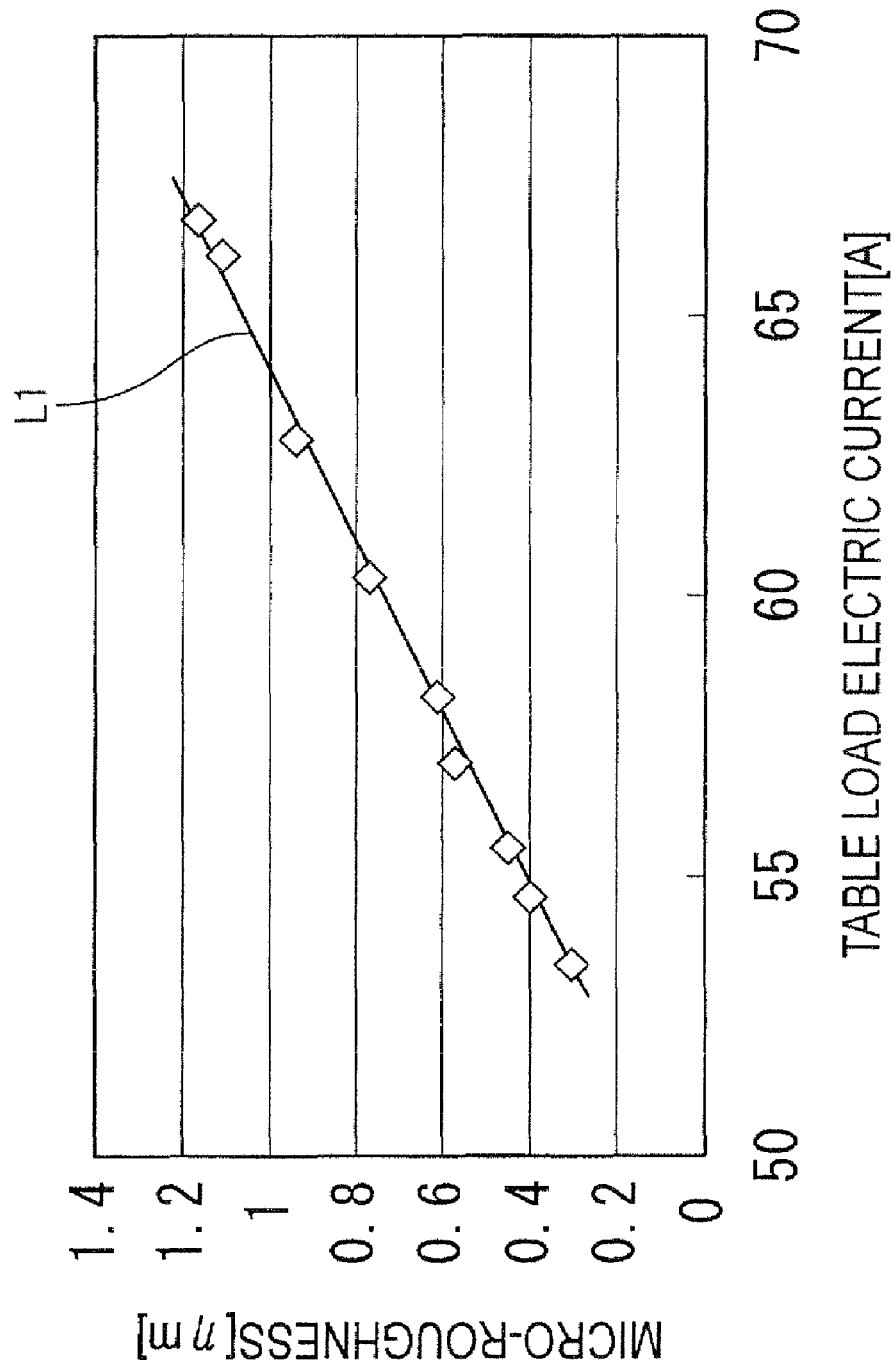
FIG. 3 is a graph showing a relationship between a load current applied on a polishing table and micro-roughness in a first polishing step of the above embodiment.

Initially, it is confirmed that the relationship between the load current of the polishing table 2 and the micro-roughness Rq after the first polishing step S51 of the semiconductor wafer W can be determined as shown in FIG. 3, the load current value increases in accordance with the magnitude of the micro-roughness Rq. Accordingly, it can be recognized that there is the relationship as shown in equation (2) between the micro-roughness Rq and the load current value I as shown in FIG. 3.

In the following, a constant C represents an inclination of regression line L1 in FIG. 3, and a constant Ao is the load current value when little micro-roughness is present.

$$Rq = C(I - Ao) \quad (2)$$

Figure 4:
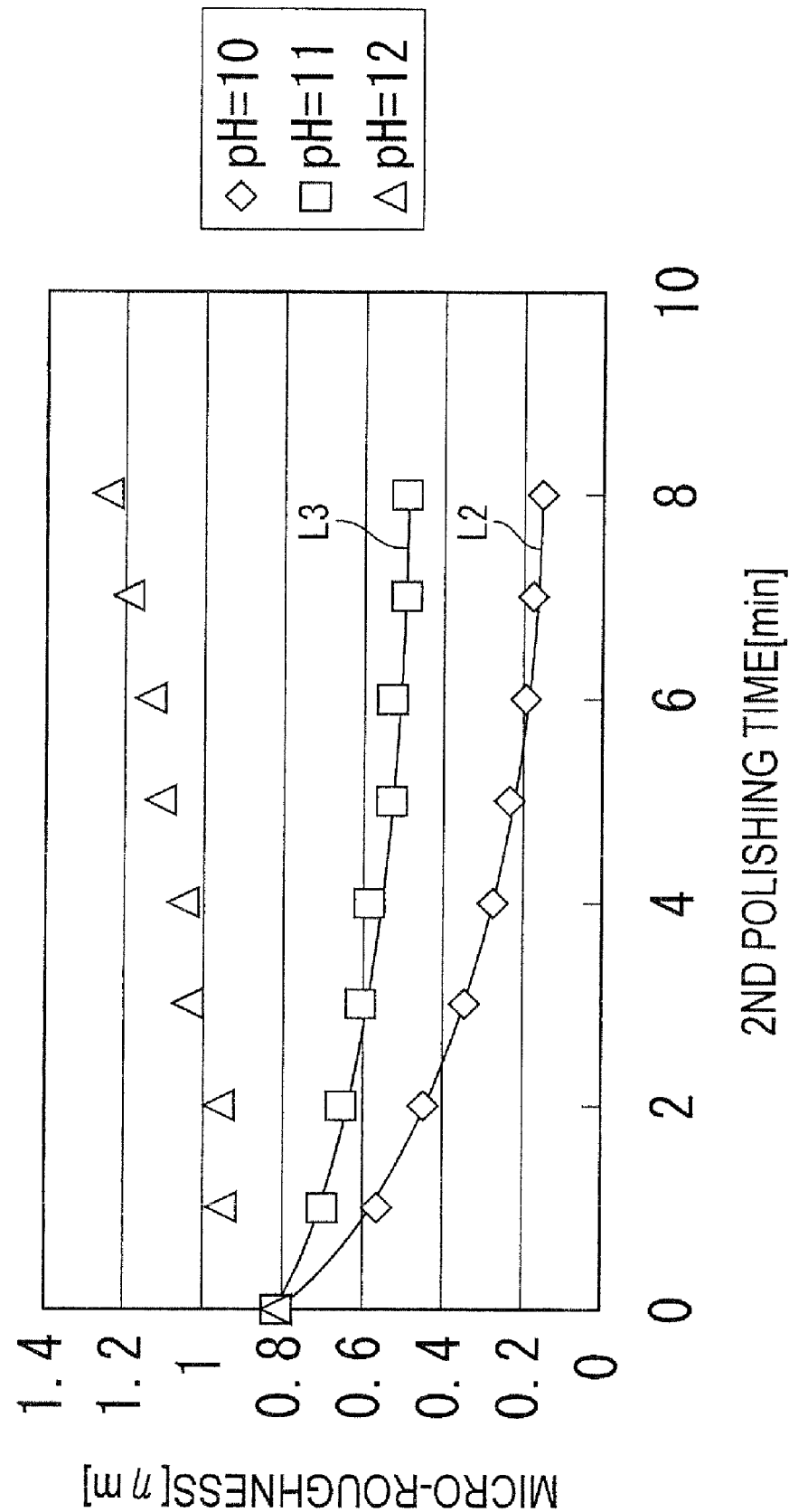
FIG. 4 is a graph showing a relationship between alkali pH value/polishing time and micro-roughness in a second polishing step of the above embodiment.
Figure 5:
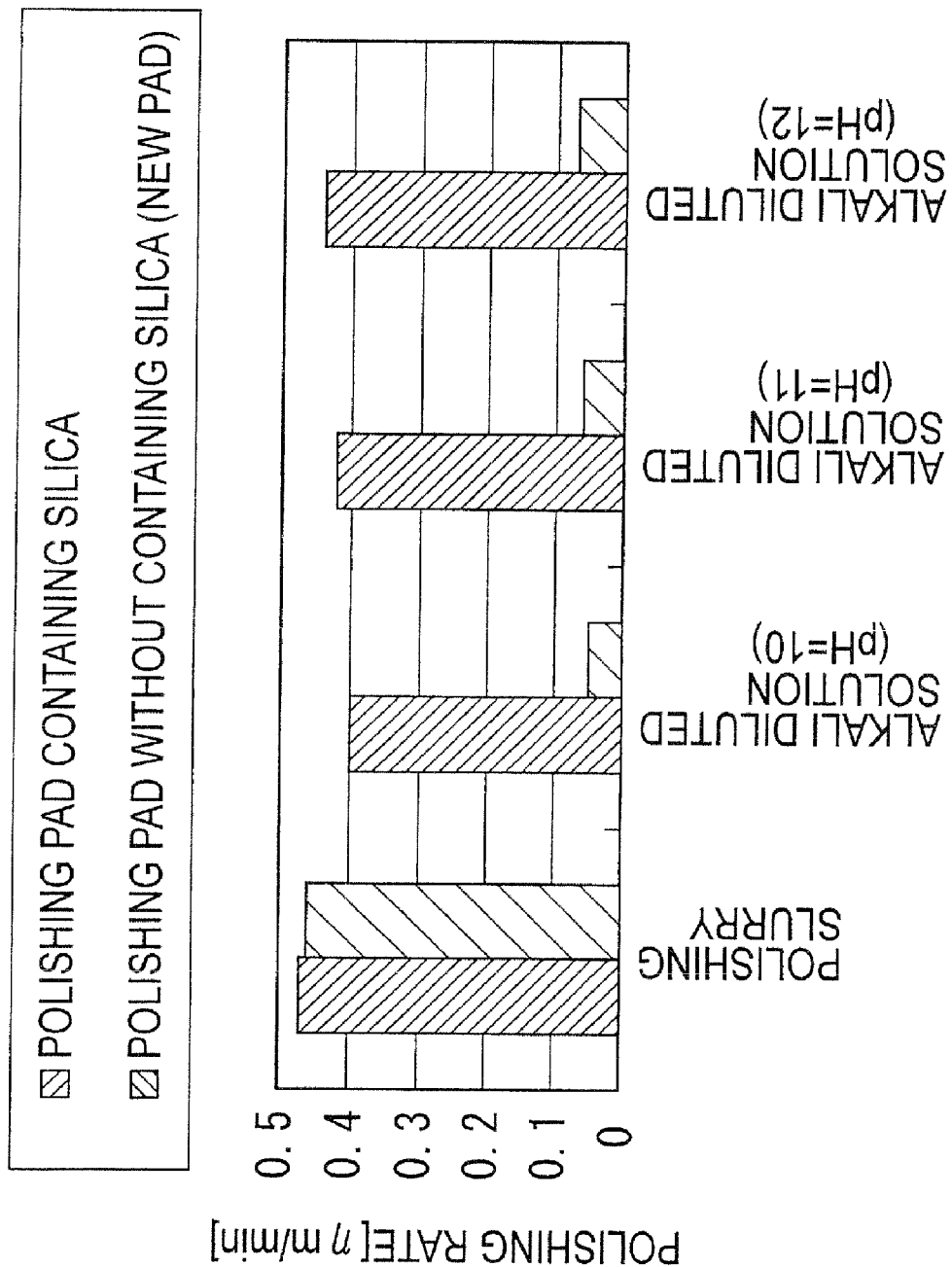
FIG. 5 is a graph showing an effect and advantage of the above embodiment.

Next, the pH value of alkali solution in the second polishing step S52 is taken at three levels in a range of pH10-12 and a change in the micro-roughness Rq in accordance with polishing time t is measured. Then, as shown in FIG. 4, the micro-roughness Rq degrades when the polishing time t becomes long at pH12 on account of too strong alkaline property.

On the other hand, it is confirmed that the micro-roughness Rq decreases in accordance with the polishing time t at pH11 and pH10 levels.

Considering the graphs L2 and L3 plotting pH10 and pH11 as an approximate expressions of exponent function (exponent base of 10), the pH value before the second polishing step S52 (i.e. pH value at 0min in FIG. 4) becomes pH value SpH of the slurry in the first polishing step S51, where the relationship expressed by the following equation (3) can be found with the pH value ApH in the second polishing step S52. Incidentally, λ in the equation (3) denotes correction coefficient acquired by the measurement, which changes in accordance with the curve of the respective pH values in FIG. 4.

$$Rq \propto 10^{(-\lambda(SpH-ApH)t)} \quad (3)$$

Based on the above equations (2) and 83}, there is the relationship represented by the above-mentioned equation (1) between the load current value I and the pH value SpH of the slurry in the first polishing step S51 and between the pH value ApH of alkali solution and the polishing time t in the second polishing step S52. The pH value ApH and the polishing time t can be set based on the equation (1), the load current value I and the pH value SpH of slurry in the first polishing step S51. Incidentally, the polishing time t is preferably set as a predetermined constant value and the pH value ApH of alkali solution is preferably set in accordance with the polishing time.

Back to FIG. 2, the command control unit 83 generates a control command for adjusting pH value of the alkali solution based on the pH value detected by the pH meter 52 of the alkali solution actually flowing through the pipework, and outputs the control command to the alkali-concentrate-solution flow control unit 84. In other words, the alkali-concentrate-solution flow control unit 84 conducts a feedback control of the flow-regulating valve 61 by the command control unit 83.

Further, the command control unit 83 acquires the pH value of the slurry in the first polishing step S51 from the pH meter 52.

The alkali-concentrate-solution flow control unit 84 controls the opening degree of the flow-regulating valve 61 based on the pH value of the alkali solution calculated by the pH calculating unit 82 to adjust the supply of the alkali concentrate solution mixed by the aspirator 51. Further, the alkali-concentrate-solution control unit 84 controls the supply of the alkali concentrate solution based on the pH value of the alkali solution mixed by the aspirator 51 in accordance with the control command by the command control unit 83 to regulate the pH value of the alkali solution supplied to the polishing table 2 within a range from pH10 or more to less than pH12.

The slurry/deionized-water flow control unit 85 controls the flow rate of the flurry and deionized water respectively supplied from the slurry-supplying unit 4 and the deionized-water supplying unit 5.

[3] Operation and Advantage of Embodiment

Next, the operation of the rough-polishing method by the above-described polishing apparatus 1 will be described below.

In the first polishing step S51, the slurry/deionized-water flow control unit 85 adjusts the flow rate of the slurry supplied from the slurry-supplying unit 4 to the polishing table 2 based on the rough-polishing condition set by an operator in advance, and simultaneously controls the rotation of the polishing table 2 and the polishing head 3 to conduct the rough-polishing step in the first polishing step S51.

At this time, based on the detection signal from the drive current detector 7, the load-current calculating unit 81 calculates the load current value I applied to the polishing table 2 on account of pressing of the semiconductor wafer W in the first polishing step S51 and outputs the load current value I to the pH calculating unit 82.

The command control unit 83 acquires the pH value SpH of the slurry in the first polishing step S51 from the pH meter 52 and outputs the pH value to the pH calculating unit 82.

The pH calculating unit 82 calculates the pH value ApH of the alkali solution in the second polishing step S52 using the above equation (1) based on the acquired load current value I, the pH value SpH of the slurry, and the polishing time t in the second polishing step S52 set by an operator in advance and stores the calculated pH value ApH in a memory (not shown).

When the first polishing step S51 is completed, the slurry/deionized-water flow control unit 85 stops supplying the slurry by the slurry-supplying unit 4 and starts supplying deionized water from the deionized-water supplying unit 5 to rinse the polishing surface of the semiconductor wafer W.

When sufficient rinsing is completed, the alkali-concentrate-solution flow control unit 84 calculates the amount of alkali solution to be mixed by the aspirator 51 based on the pH value ApH of the alkali solution stored in the memory and controls the opening degree of the flow-regulating valve 61 to start the second polishing step S52.

When the second polishing step S52 is started, the command control unit 83 generates a control command for adjusting the pH value based on the pH value of the alkali solution detected by the pH meter and outputs the control command to the alkali-concentrate-solution control unit 84. The alkali-concentrate-solution control unit 84 conducts a feedback control of the flow-regulating valve 61 in accordance with the adjustment control command.

The semiconductor wafer W thus polished in the second polishing step S52 is applied with a mirror-finish polishing in the finish-polishing step S6 to provide a Haze.

In the present embodiment, since the second polishing step S52 is sequentially conducted after the first polishing step S51, a part of the slurry supplied in the first polishing step S51 remains on the polishing cloth 23 even after rinsing, where polishing effect continues due to the presence of the residual silica in the second polishing step S52 using only the alkali solution. Accordingly, polishing rate is not decreased when the slurry in the first polishing step S51 is changed to the alkali solution of pH10 to pH12.

On the other hand, when the second polishing step S52 is conducted using a new polishing cloth 23, it is confirmed that the polishing rate in the second polishing step S52 is considerably reduced.

Figure 6:
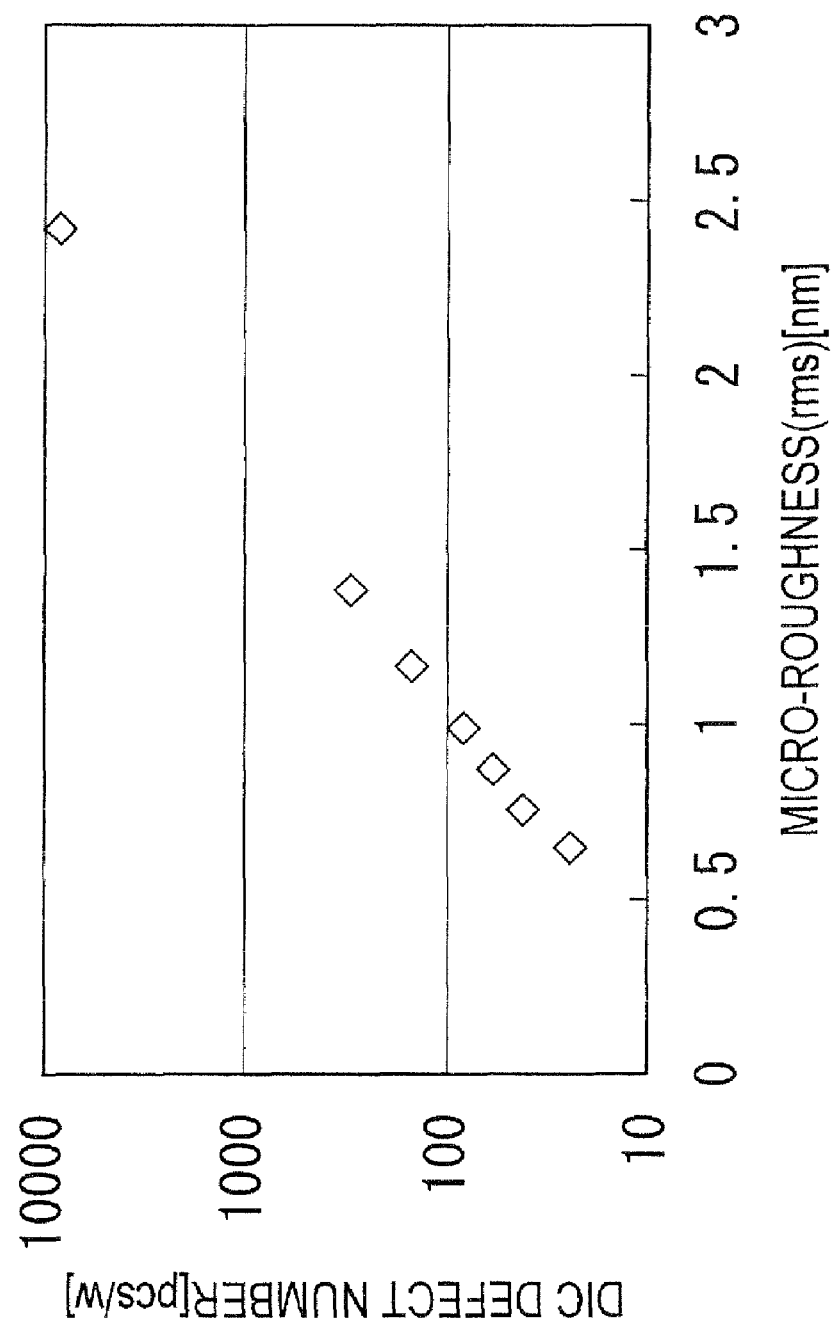
FIG. 6 is a graph showing an effect and advantage of the above embodiment.

Further, the micro-roughness Rq in the rough-polishing step affects on surface LPD (Light-Point Defect). As shown in FIG. 6. it is confirmed that the magnitude of the micro-roughness Rq is approximately in proportion to the number of DIC (Differential-Interference Contrast) measured by a particle counter SP1 (manufactured by KLA-Tencor Corporation).

Accordingly, by the rough-polishing of the semiconductor wafer W with the first polishing step S51 and the second polishing step S52, the surface LPD measured by a particle counter SP1 can be considerably reduced.

[4] Modification of Embodiment

Incidentally, the scope of the present invention is not limited to the above-described embodiment, but includes the following modifications.

In the above embodiment, the rough-polishing is conducted in two stages, i.e. the first polishing step S51 for polishing the semiconductor wafer W with the slurry and a second polishing step S52 for polishing the semiconductor wafer W with an alkali solution. However, the rough-polishing may be conducted without providing clear distinction between the two steps: for instance, the slurry-polishing may be continuously transitioned into the alkali-solution polishing.

Though the rough-polishing of the semiconductor wafer according to the present invention is conducted with a sheet-feed polishing apparatus 1, the rough-polishing method of the present invention may be applied to a double-side polishing apparatus in which a plurality of semiconductor wafers are housed within a carrier and both sides of the plurality of semiconductor wafers are polished at a time by rotating the carrier using an inner gear and an outer gear.

Specific process and structure for implementing the present invention may be altered as long as an object of the present invention can be achieved.

The priority application Number JP 2006-267286 upon which this patent application is based is hereby incorporated by reference.

What is claimed is:

1. A polishing apparatus of a semiconductor wafer for polishing a semiconductor wafer, comprising:

a polishing table rotated by a drive current and provided with a polishing pad;

a slurry-supplying unit for supplying polishing slurry to the polishing table;

a controller for controlling the polishing table and the slurry-supplying unit, the semiconductor wafer being pressed onto the polishing table and being polished by the slurry supplied by the slurry-supplying unit;

an alkali-concentrate-solution supplying unit for supplying an alkali concentrate solution to the polishing table;

a deionized-water supplying unit for supplying deionized water to the polishing table;

a flow-regulating valve that adjusts the flow rate of the alkali concentrate solution from the alkali-concentrate-solution supplying unit; and a drive current detecting unit that detects the drive current to the polishing table, the controller comprising:

a load current calculating unit that calculates a load current generated on the polishing table while polishing using the slurry based on the drive current detected by the drive current detecting unit;

a pH value determining unit that determines, based on the calculated load current, a pH value of an alkali solution supplied from the flow-regulating valve to the polishing table, the alkali solution being prepared by mixing the alkali concentrate solution and the deionized water, and a flow control unit for controlling the flow rate of the flow-regulating valve based on the determined pH value.

2. The polishing apparatus of a semiconductor wafer according to claim 1, wherein the pH value determining unit determines the pH value of the alkali solution based on the flowing equation (1), where the root mean square roughness of the surface of the semiconductor wafer polished with the slurry is Rq, the load current value of the polishing table is I, the pH value of the slurry is SpH, the pH value of the alkali solution to be supplied is ApH, and calculates the flow rate of the alkali concentrate solution from the alkali-concentrate-solution supplying unit and the deionized water from the deionized-water supplying unit based on the pH value of the alkali solution, $$Rq = C(I - Ao) * 10^{(-\lambda(SpH - ApH)t)} \tag{1}$$

and where C and Ao are constant, and $\lambda$ is an empirically-calculated correction coefficient.

3. The polishing apparatus of a semiconductor wafer according to claim 1, wherein a pH value detecting unit for detecting the pH value of the alkali solution to be supplied to the polishing table is provided on a downstream of the flow-regulating valve, and the controller comprises a command control unit that adjusts a control command from the flow control unit based on the pH value detected by the pH value detecting unit.

* * * * *